US012287084B2

(12) United States Patent
Gronenborn

(10) Patent No.: US 12,287,084 B2
(45) Date of Patent: Apr. 29, 2025

(54) DIFFUSOR LENS, LIGHT SOURCE, METHOD OF FABRICATING A LIGHT SOURCE AND METHOD OF ILLUMINATING A SCENE

(71) Applicant: TRUMPF Photonic Components GmbH, Ulm (DE)

(72) Inventor: Stephan Gronenborn, Aachen (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 834 days.

(21) Appl. No.: 17/491,650

(22) Filed: Oct. 1, 2021

(65) Prior Publication Data

US 2022/0107077 A1     Apr. 7, 2022

(30) Foreign Application Priority Data

Oct. 6, 2020   (EP) .................................... 20200359

(51) Int. Cl.
*F21V 5/04*     (2006.01)
*F21Y 115/30*   (2016.01)
(Continued)

(52) U.S. Cl.
CPC .............. *F21V 5/04* (2013.01); *G02B 3/0087* (2013.01); *G02B 3/08* (2013.01); *H01S 5/18305* (2013.01);
(Continued)

(58) Field of Classification Search
CPC ..... G02B 3/0087; G02B 3/08; H01S 5/18388; H01S 5/18386–18394
See application file for complete search history.

(56) References Cited

U.S. PATENT DOCUMENTS 2,877,342 A      3/1959   Beach
5,073,041 A  *  12/1991   Rastani ................... H01S 5/423
                                                            372/101
(Continued)

FOREIGN PATENT DOCUMENTS

EP          3447862 A1  *  2/2019   ........... G01S 7/4815

OTHER PUBLICATIONS

Suhara, et al., "Graded-Index Fresnel Lenses for Integrated Optics," *Applied Optics* 21, 11, Jun. 1982, pp. 1966-1971, The Optical Society, Washington DC, USA.
(Continued)

*Primary Examiner* — Sean P Hagan
(74) *Attorney, Agent, or Firm* — LEYDIG VOIT & MAYER LTD.

(57) ABSTRACT

A diffuser lens includes a first annular lens segment and a second annular lens segment. The first and the second lens segments are concentric. A refractive index of the first and second lens segments in a cross-section along a plane including an optical axis of the diffusor lens is described by a refractive index profile which varies in a direction perpendicular to the optical axis. The refractive index profile includes a first sub-profile, which describes the refractive index profile of the first lens segment, and a second sub-profile, which describes the refractive index profile of the second lens segment. The first sub-profile transitions to the second sub-profile at an interface. These first and second sub-profiles have slopes with opposite signs.

15 Claims, 8 Drawing Sheets

(51) Int. Cl.
*G02B 3/00* (2006.01)
*G02B 3/08* (2006.01)
*H01S 5/00* (2006.01)
*H01S 5/183* (2006.01)
*H01S 5/042* (2006.01)

(52) U.S. Cl.
CPC ....... *H01S 5/18388* (2013.01); *F21Y 2115/30* (2016.08); *H01S 5/005* (2013.01); *H01S 5/04257* (2019.08); *H01S 5/18347* (2013.01)

(56) References Cited

U.S. PATENT DOCUMENTS

| | | | |
|---|---|---|---|
| 5,152,787 A | | 10/1992 | Hamblen |
| 5,404,869 A | * | 4/1995 | Parkyn, Jr. ............. G02B 27/09 |
| | | | 136/246 |
| 5,676,453 A | | 10/1997 | Parkyn, Jr. et al. |
| 5,966,399 A | * | 10/1999 | Jiang ................... H01S 5/18388 |
| | | | 372/99 |
| 2012/0060920 A1 | * | 3/2012 | Fornari ................... F24S 23/31 |
| | | | 359/619 |
| 2013/0272330 A1 | | 10/2013 | Joseph et al. |
| 2014/0044392 A1 | | 2/2014 | Fattal |
| 2015/0355389 A1 | * | 12/2015 | Williams ............... G02B 1/041 |
| | | | 359/615 |
| 2018/0283654 A1 | | 10/2018 | Worman et al. |
| 2019/0250310 A1 | * | 8/2019 | Lin ........................ G02B 3/08 |
| 2019/0277478 A1 | | 9/2019 | Streppel |
| 2020/0333445 A1 | | 10/2020 | Gronenborn |

OTHER PUBLICATIONS

Kim, et al., "Elimination of Flux Loss by Optimizing the Groove Angle in Modified Fresnel Lens to Increase Illuminance Uniformity, Color Uniformity and Flux Efficiency in LED Illumination," *Optics Express* 17, 20, Sep. 2009, pp. 17916-1, Optical Society of America, Washington DC, USA.

* cited by examiner

DIFFUSOR LENS, LIGHT SOURCE, METHOD OF FABRICATING A LIGHT SOURCE AND METHOD OF ILLUMINATING A SCENE

CROSS REFERENCE TO RELATED APPLICATIONS

This application claims benefit to European Patent Application No. EP 20 200 359.6, filed on Oct. 6, 2020, which is hereby incorporated by reference herein.

FIELD

The present disclosure relates to a diffusor lens. The present disclosure further relates to a light source comprising a Vertical Cavity Surface Emitting Laser (VCSEL) and such a diffusor lens for diffusing the light emitted by the VCSEL. The present disclosure still further relates to a method of fabricating such a light source. The present disclosure still further relates to a method of illuminating a scene, in particular for sensing applications.

BACKGROUND

VCSELs, in particular VCSEL arrays with engineered diffusors to create a rectangular beam profile in the field of view (FOV) of a camera are nowadays commonly used as illumination sources for 2D and 3D cameras. Extensive research is done on how to integrate the diffusors in the VCSEL chip as this integration typically leads to several problems which need to be overcome.

To achieve a good homogeneity of the preferred rectangular beam profile in the FOV of the camera, the diffusors need to be small. The diffusors may, for example, be an array of diffusor lenses. The small size of these diffusor lenses however results in diffraction losses as the lens array is typically illuminated homogenously, which leads to several incoming beams not ideally entering the center of each lens. These diffraction losses lead to inhomogeneity in the desired beam profile and reduce the quality of the desired sensing applications.

One possibility to overcome these problems is to use larger lenses. Using one or more larger lenses may avoid the discussed diffraction losses, but large apertures of the lenses automatically lead to a large height difference of the lenses along the optical axis, i.e., large lens sag. Large lenses with such a large height difference in their surface profile are difficult to integrate into a semiconductor chip with fabrication techniques such as grayscale lithography.

Fresnel lenses allow the construction of lenses with large aperture and reduce the lens sag compared to a conventional lens by dividing the lens into a set of concentric annular sections. The height difference is thus efficiently reduced compared to an equivalent standard lens. A problem that arises for Fresnel lenses is however that the design of a Fresnel lens is typically achieved by dividing the continuous surface of a standard lens into a set of curved surfaces, with stepwise discontinuities between them. These discontinuities cause losses and inhomogeneities in the desired beam profile.

Thus, there remains a need for an improved diffusor lens, in particular for illumination sources for 2D and 3D cameras.

SUMMARY

In an embodiment, the present disclosure provides a diffusor lens. The diffuser lens includes a first annular lens segment and a second annular lens segment. The first and the second lens segments are concentric. A refractive index of the first and second lens segments in a cross-section along a plane including an optical axis of the diffusor lens is described by a refractive index profile which varies in a direction perpendicular to the optical axis. The refractive index profile includes a first sub-profile, which describes the refractive index profile of the first lens segment, and a second sub-profile, which describes the refractive index profile of the second lens segment. The first sub-profile transitions to the second sub-profile at an interface. These first and second sub-profiles have slopes with opposite signs.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1B:
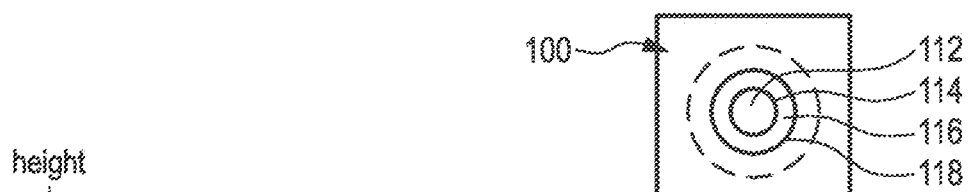
FIG. 1B shows a top view of the same Fresnel lens.

The present disclosure provides an improved flat diffusor lens for diffusing incoming light such that a homogenous rectangular profile in a target area is achieved. This created homogenous beam profile may match, e.g., to the field of view of a camera and thus allows reliable sensing applications, such as time-of-flight (TOF) measurements.

The present disclosure further provides a light source with such an improved diffusor lens.

The present disclosure further provides a fabrication method of such a light source with an improved diffusor lens.

The present disclosure further provides a method of illuminating a scene.

According to a first aspect of the present disclosure, a diffusor lens is provided that comprises a first annular lens segment and a second annular lens segment. The first and the second lens segment are concentric with respect to each other. A refractive index of the first and second lens segment in a cross-section along a plane including an optical axis of the diffusor lens is described by a refractive index profile which varies in a direction perpendicular to the optical axis. This refractive index profile comprises a first sub-profile which describes the refractive index profile of the first lens segment and a second sub-profile which describes the refractive index profile of the second lens segment. Further, the first sub-profile transitions to the second sub-profile at an interface and the first and second sub-profile have a slope with opposite sign.

The present disclosure is based on the idea to provide a flat diffusor lens which may be preferably used in an array of VCSELs to transform incoming light to homogenously illuminate a scene, such as a field of view of a camera. For this purpose, the diffusor lens comprises at least two annular lens segments, wherein the first lens segment is concentrically arranged with respect to the second lens segment. This means that the first lens segment and the second lens segment share the same center, i.e., the center of the diffusor lens.

The expression "annular" means that the first lens segment and the second lens segment are ring-shaped. The shape of the ring may preferably be circular, but may also comprise other shapes being formed like a ring, such as an elliptical shape.

It shall be noted that the expression "first and second lens segment" shall not be understood as two independent lenses or lens parts, but rather as sections of one single diffusor lens. Further, the first sub-profile and the second sub-profile are parts of the refractive index profile which describes a refractive index of the first and second lens segment in a cross-section along a plane including the optical axis of the diffusor lens. In other words, the refractive index profile describes a common profile which describes the refractive index of the diffusor lens for at least a part of the diffusor lens.

The concept of a lens divided into two or more sections or elements is already known from Fresnel lenses. An ideal Fresnel lens comprises an infinite number of such lens segments with curved surfaces and with stepwise discontinuities between them. At these stepwise discontinuities, the surface of a Fresnel lens is oriented parallel to the optical axis of the Fresnel lens. Hence, a standard Fresnel lens comprises (at least) two lens segments which adjoin at an interface, wherein one of these lens segments has a curved surface and the other lens segment is oriented parallel to the optical axis of the Fresnel lens, i.e., as a height step oriented along the optical axis.

B. Kim et al.: "Elimination of flux loss by optimizing the groove angle in modified Fresnel lens to increase illuminance uniformity, color uniformity, and flux efficiency", Optics Express, 17 (20), pp. 17916-17927 (2009) addresses the problem that Fresnel lenses can usually cause a loss of flux efficiency and non-uniform distribution of illuminance due to secondary refraction by the surface discontinuities, especially along the groove facet, i.e., along the height step. A modified Fresnel lens is disclosed for which the groove angle is optimized to maximize the uniformity in illumination.

In difference to said modified lens of B. Kim et al. and in difference to a standard Fresnel lens, the diffusor lens according to the present disclosure does preferably not comprise a series of annular height steps at the surface of the lens as the diffusing properties of the diffusor lens according to the present disclosure are rather caused by different lens segments with a varying refractive index. In other words, the diffusing properties of the diffusor lens according to the present disclosure are caused by having a varying refractive index along the width of the diffusor lens.

The diffusor lens according to the present disclosure comprises adjacent lens segment whose optical properties are caused by a varying refractive index profile in a cross-section along a plane including the optical axis of the diffusor lens. Flat Fresnel lenses with a varying refractive index profile are already known in the art, see e.g., T. Suhara et al., "Graded-index Fresnel lenses for integrated optics", Applied Optics, 21(11), pp. 1966-1971 (1982). In difference to the Graded-Index (GRIN) Fresnel lens disclosed in Suhara et al., the varying refractive index profile of the diffusor lens according to the present disclosure comprises adjacent sub-profiles which have a slope with opposite sign. This means that the refractive index profile transitions from a refractive index profile having a positive finite slope into a refractive index profile having a negative finite slope, and vice versa. The sub-profiles may be curved. In this case this also means that the refractive index profile transitions from a convexly curved refractive index profile into a concavely curved refractive index profile, and vice versa. The refractive index profile of the diffusor lens according to the present disclosure does thus not comprise the problematic height steps as known from GRIN-Fresnel lens disclosed so far.

The diffusor lens according to the present disclosure may be a single optical element, which may be one piece or monolithic, and which combines the capabilities to transform light emitted by any kind of light emitting elements into a homogeneous diffused beam profile in a target area. This measure provides simple, not bulky and low cost optics. Preferably, the single one-piece optical element may be integrated on a VCSEL array chip, but may also be arranged in a distance from the VCSEL array.

It shall be understood that the expression "diffusor lens" means that this lens is configured to diffuse light in one or more directions parallel to or inclined with respect to the optical axis of the diffusor lens.

Further, the expression "lens" shall be understood as any kind of object which is configured to affect light which is penetrating through the lens.

Preferred embodiments of the diffusor lens will be described hereinafter. Preferred embodiments are not only those indicated in the dependent claims, but also those indicated in the entire disclosure herein.

In one embodiment, the slopes of the first sub-profile which describes the refractive index profile of the first lens segment and the second sub-profile which describes the refractive index profile of the second lens segment may be described by a same function but with opposite sign. As known in the art, the slope of a function is the first derivative function of said function. According to the present embodiment, said first derivative function (slope function) which describes the slopes of the first sub-profile and the second sub-profile is the same but with opposite sign. In other words, the slopes of the first sub-profile and the second sub-profile are described by the same function except that the sign of the slope is reversed. This means that the slope of the first sub-profile is, e.g., a positive slope while the slope of the second sub-profile is a negative slope. When the first sub-profile and the second sub-profile are spherical for example, this means that the radius of curvature of these sub-profiles may have the same absolute value, but a different sign. The same concept may apply if the sub-profiles are aspherical, wherein an aspherical refractive index profile may be a conical profile or any other non-spherical profile. Hence, the varying refractive index of first and the second lens segments is adapted to transform incoming beams such that the same diffused beam profile is generated.

The slope function (first derivative function) which describes the slopes of the first sub-profile and the second sub-profile may be proportional to $r^n$ with r being a radius of the diffusor lens and $n \geq 0$. Hence, the slope function (first derivate function) may be proportional to a constant for $n=0$. This is, e.g., the case if the first sub-profile and the second sub-profile have the shape of a linear function in cross-section along a plane including the optical axis of the diffusor lens. This is, for example the case for a conical refractive index profile, wherein the conical refractive index profile in cross-section along a plane including the optical axis is formed by a straight surface line of the cone. For $n>0$, the slope function may also be a polynomial function. The slope is not infinite. When the first and second sub-profiles are curved, it is also possible to describe the first sub-profile and the second sub-profile by their curvature function, which is the second derivative function of the sub-profiles. In this case, the curvatures of the first and second sub-profiles may be the same for the first and second sub-profiles, but having a different sign with respect to each other, for example one is convexly curved, and the other is concavely curved.

The diffusor lens may be a gradient index (GRIN) lens or a meta-lens. In both cases, the height of the diffusor lens along its optical axis is preferably constant over the width of the diffusor lens.

In case the diffusor lens is a GRIN lens, the varying refractive index of the diffusor lens (i.e., a gradient of the refractive index) is caused by changing the composition of the material of which the GRIN lens is manufactured along the width or radial distance of the diffusor lens. This may, e.g., be caused by changing the doping of the material. Several techniques as known in the art, such as neutron irradiation, chemical vapour deposition, partial polymerisation, ion exchange, ion stuffing or direct laser writing are suitable for the fabrication of such a GRIN lens.

The simple geometry of a GRIN lens allows a very cost-effective production and simplifies the assembly of the diffusor lens essentially. Further, varying the lens height implies a high flexibility for changing or adapting the optical properties.

In case the diffusor lens is a meta-lens, the varying refractive index of the diffusor lens is caused by several nanostructures built on the surface of a substrate material. The nanostructures may be spatially separated by airgaps in between. The nanostructures at the subwavelength scale are made of high refractive index materials which interact with the incident light to shape the amplitude and phase of the light. Such a meta-lens provides a wide platform for controlling light in ways that would not be possible with conventional lenses.

The diffusor lens according to the present disclosure may be a meta-lens formed by several nanostructures arranged such that a first annular lens segment and a second annular lens segment, which are concentric with respect to each other, are formed on a surface of a substrate (as known for Fresnel meta-lenses known in the art). In difference to the Fresnel meta-lenses known in the art, the nanostructures are shaped and arranged such that the first sub-profile which describes the refractive index profile of the first lens segment and the second sub-profile which describes the refractive index profile of the second lens segment have a slope or curvature with opposite sign.

In other words, the nanostructures are shaped and arranged such that the refractive index of the overall first lens segment in a cross-section along a plane including the optical axis of the diffusing lens is described by a first sub-profile which has, e.g., a negative slope, e.g. a convex shape. In the second lens segment, the nanostructures are shaped and arranged such that the refractive index of the overall second lens segment in a cross-section along a plane including the optical axis of the diffusing lens is described by a second sub-profile which has, in turn, a positive slope, e.g. a concave shape.

In this case, the first sub-profile which describes the refractive index profile of the first lens segment and the second sub-profile which describes the refractive index profile of the second lens segment both describe how the different shapes and arrangements of nanostructures in the first lens segment and the second lens segment lead to an overall varying refractive index of the diffusor lens in a direction perpendicular to the optical axis.

The major advantage of such a meta-lens approach is that the diffusor lens may be extremely thin (nanometer scale) which drastically reduces chromatic aberrations. Further, meta-lenses or metasurfaces can be mass produced in existing CMOS semiconductor foundries, enabling massively-parallel wafer-scale integration of optical systems.

Both approaches, the GRIN lens approach as well as the meta-lens approach have in common that the height of the diffusor lens along its optical axis can preferably be constant over the width of the diffusor lens. However, it shall be understood that this is not necessarily the case and the height of the meta-lens may, e.g., vary on the nanometer scale.

Preferably, the transition from the first sub-profile to the second sub-profile at the interface is continuous and not continuously differentiable. The refractive index profile of the diffusor lens does not have a problematic height step causing optical losses and inhomogeneities. This provides advantages over a standard Fresnel lens approach, where the lens segments have stepwise discontinuities between them. As the sub-profile of the first lens segment and the second sub-profile of the second lens segment have a slope or curvature with opposite sign, the crossover or transition from the first sub-profile to the second sub-profile at the interface of those is not continuously differentiable in this embodiment.

The diffusor lens according to the present disclosure may comprise a succession of concentric lens segments formed by the first lens segment and the second lens segment and, for example, further lens segments.

In an embodiment, the diffusor lens may not only comprise a first and a second lens segment, but a third, a fourth or even more lens segments. Comparable to an ideal Fresnel lens with an infinite number of sections or lens segments, the number of lens segments of the present diffusing element is not limited by a maximum number. The diffusor lens may have a circular geometrical aperture to create a circular light beam. In other configurations, the geometrical aperture of the diffusor lens may be rectangular, e.g. quadratic, to create a rectangular, e.g., quadratic light beam.

According to a second aspect of the present disclosure, a light source is provided that comprises a VCSEL arranged on a semiconductor substrate and configured to emit laser light as well as a diffusor lens according to the first aspect, wherein the diffusor lens is configured to diffuse the laser light emitted by the VCSEL into a target area.

Preferably, the diffusor lens is integrated with the VCSEL as one device.

Typically, a VCSEL may be considered as a quasi-punctiform light emitting element which emits a slightly diverging light cone. The emitted light cone of the VCSEL passes through the transmissive diffusor lens, which transforms the light emitted by the VCSEL into a beam profile with homogeneous intensity distribution in a target area.

In an embodiment, the diffusor lens may be integrated in the semiconductor substrate on which the VCSEL is arranged. As mentioned above, the diffusor lens may be a GRIN lens or a meta-lens. In case of a meta-lens, several nanostructures are formed on the surface of the substrate. In case of a GRIN lens, the varying refractive index of the diffusor lens (i.e., a gradient of the refractive index) may be caused by changing the composition (i.e. doping) of the substrate in which the diffusor lens may be integrated.

The VCSEL may be a bottom emitter which is arranged to emit the laser light through the semiconductor substrate. The diffusor lens may in this case be provided on a surface of the semiconductor substrate or integrated into the semiconductor substrate which is arranged opposite with respect to the substrate surface on which the VCSEL is arranged.

The VCSEL may also be a top emitter which is arranged to emit the laser light in a direction away from the semiconductor substrate. The diffusor lens may comprise in this embodiment transparent material provided on top of the semiconductor layer structure of the VCSEL. The material is transparent in the wavelength range of the laser light (e.g., in the wavelength range between 750 nm-1200 nm). The transparent material may be provided on top of the mesa of the VCSEL.

The light source may further comprise an array of VCSELs arranged on a common semiconductor substrate. The VCSELs of the array are configured to emit laser light and associated with one or more diffusor lenses. The one or more diffusor lenses are configured to diffuse the laser light emitted by the VCSELs.

The VCSELs may be characterized by an active laser light emission area with an area between 3 $\mu m^2$ and 10000 $\mu m^2$. The pitch or distance between the VCSELs comprised by the VCSEL array may be between 20 $\mu m$ and 250 $\mu m$. The density of the VCSELs and/or the size of the light emission area may be different depending on the position in the VCSEL array and/or the shape of the common optical structure illuminated by the respective VCSEL such that the intensity of the illumination pattern can be adapted.

At least a part of the VCSELs may be arranged to be individually controlled to emit laser light. Each VCSEL or two, three, four or more groups of VCSELs of the VCSEL array may be arranged to be individually switched on or off in order to illuminate one or more sectors of the illumination pattern in a defined sequence. The VCSEL array comprises respective electrodes in order to enable individual control of the VCSELs or groups of VCSELs. Individual control of the VCSELs or groups of VCSELs (sub-arrays) may allow electronic adjustment of the illumination pattern.

According to a third aspect, a method of fabricating such a light source is provided. The method comprises the steps of providing a VCSEL arranged on a semiconductor substrate, and integrating a diffusor lens according to the first aspect with the VCSEL.

The steps need not necessarily be performed in the order given above.

According to a fourth aspect, a method of illuminating a scene is provided. This method comprises the steps of providing a VCSEL, providing a diffusor lens according to the first aspect, causing the VCSEL to emit laser light, and diffusing, by the diffusor lens, the laser light emitted by the VCSEL into a target area.

Also these steps need not necessarily to be performed in the order given above.

It shall be further understood that the diffusor lens, light source and methods have similar and/or identical preferred embodiments.

Further advantageous embodiments are defined below.

Figure 1A:
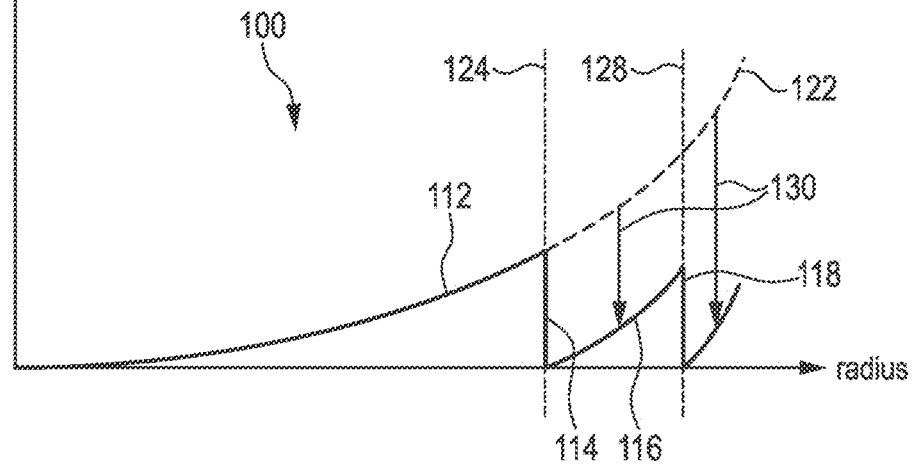
FIG. 1A shows a schematic diagram of a cross-section along a plane including the optical axis of a Fresnel lens as known in the art.

FIG. 1A shows a schematic diagram of a cross-section along a plane including the optical axis of a Fresnel lens 100 as known in the art. The height of the Fresnel lens 100 in dependence on its radius is shown in a diagram.

In difference to the continuous surface of a standard lens, the surface of a Fresnel lens 100 is divided into a set of curved surfaces with stepwise discontinuities between them. This is illustrated in FIG. 1A, where at least a first lens segment 112, a second lens segment 114, a third lens segment 116 and a fourth lens segment 118 form the overall structure of the Fresnel lens 100.

FIG. 1B shows a top view of the same Fresnel lens 100 and illustrates that a commonly known Fresnel lens 100 typically consists of a series of concentric grooves etched into the material from which the Fresnel lens 100 is formed. Fresnel lenses 100 are usually made of glass or plastic, but modern Fresnel lenses may also consist of all refractive materials.

The surface profile of the first lens segment 112 and the third lens segment 116 is convexly curved while the second lens segment 114 arranged at a first radial distance 124 and the fourth lens segment 118 arranged at a second radial distance 128 form height steps or discontinuities between the convexly-curved lens segments. The surface profile 122 of the first lens segment 112 has a curvature which is the same as the curvature of the surface profiles of the other curved lens segments, such as the third lens segment 116. Hence, the surface shapes of the other curved lens segments, such as the third lens 116, may be achieved by projecting the surface profile 122 of the first lens segment 112 along a direction parallel to the optical axis of the Fresnel lens 100. In other words, the continuous refractive surface of a traditional optics is divided and collapsed onto a bottom plane to obtain a Fresnel lens 100 as shown in FIG. 1A. This is indicated by the arrows 130 reaching from the dashed curve representing the surface profile 122 of the first lens segment 112 to the surface of the other curved lens segments.

It is clear by symmetry that the rest of the Fresnel lens 100 is the mirror image of what is illustrated in FIG. 1A. This also becomes apparent from the inlet in FIG. 1A.

A Fresnel lens 100 reduces the lens sag compared to a conventional lens and ideally comprises an infinite number of sections or lens segments. Hence, the structure is not limited to four lens segments 112, 114, 116, 118 as exemplarily shown in FIG. 1A. Their thin, lightweight construction and availability in several sizes make Fresnel lenses useful in a variety of applications.

A problem that arises by using a common diffusing Fresnel lens 100 as shown in FIG. 1A is that the height steps formed by the second lens segment 114 and fourth lens segment 118 lead to inhomogeneities in the diffused beam profile and a loss of energy in this region. This is schematically illustrated in subsequent FIG. 2.

Figure 2:
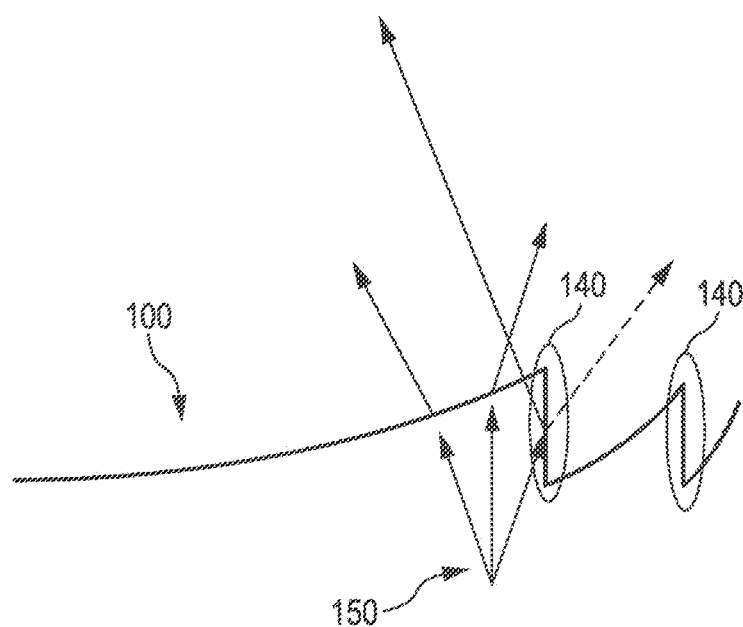
FIG. 2 shows a schematic diagram of the same Fresnel lens as shown in FIG. 1A and the light path of incoming rays passing through the diffusing Fresnel lens.

FIG. 2 shows a schematic diagram of the same Fresnel lens 100 as shown in FIG. 1A and the light path of incoming rays 150 passing through the Fresnel lens 100. The incoming rays 150 are represented by the several arrows in FIG. 2 which illustrate how a Fresnel lens 100 as known in the art diffuses incoming light. The diffraction of the incoming rays 150 by the Fresnel lens 100 indicated by these arrows is calculated by applying Snell's Law. The circles 140 indicate the areas of height differences, i.e., the sections at which the convexly-shaped surfaces of the same curvature are interrupted by discontinuities.

Some rays transmitted through each of the discontinuous surface deviate because of secondary refraction, which causes great part of optical loss at an outer region in a target area. This is exemplarily illustrated by the dashed arrow in FIG. 2. The optical efficiency and uniformity of the beam profile in the target area is thus drastically reduced by the height steps.

Figure 3:
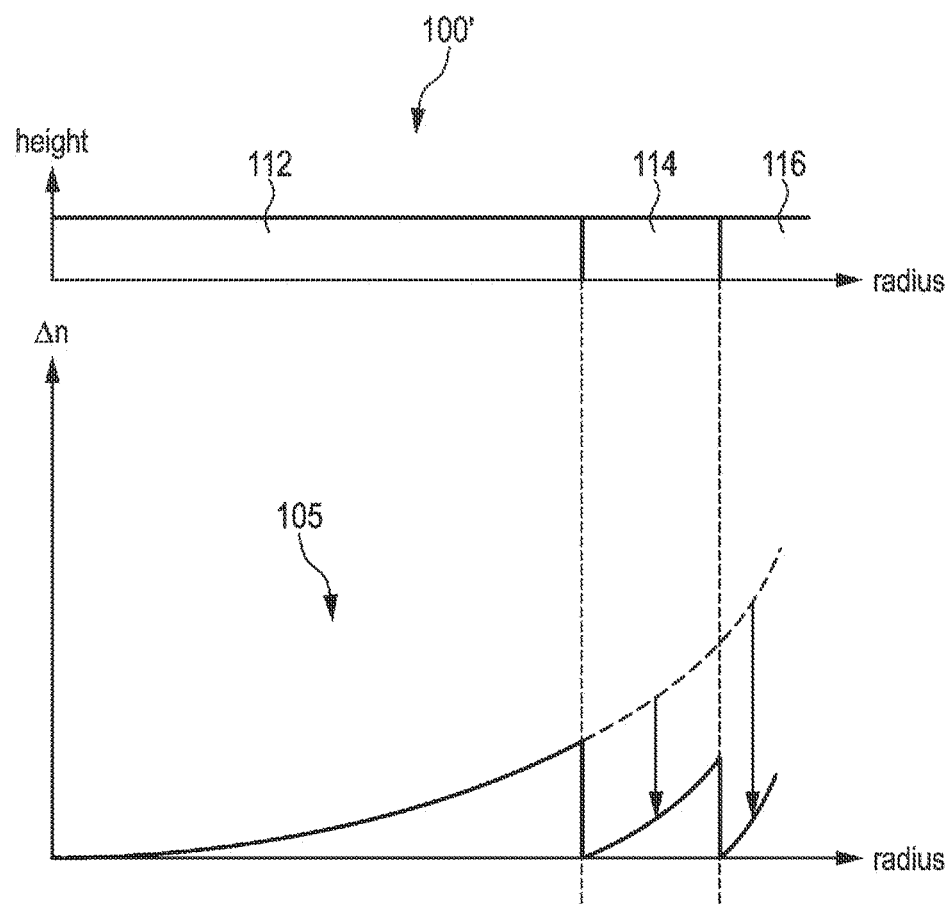
FIG. 3 shows a schematic diagram of a cross-section along a plane including the optical axis of a graded index (GRIN) Fresnel lens as known in the art.

FIG. 3 shows a schematic diagram of a cross-section along a plane including the optical axis of a graded index (GRIN) Fresnel lens 100' as known in the art. The lower diagram in FIG. 3 shows the refractive index difference $\Delta n$ in said cross-section of the GRIN Fresnel lens 100' in dependence on its radius. The upper diagram shows the constant height of the GRIN Fresnel lens 100' in dependence on its radius.

As disclosed, e.g., in T. Suhara et al., "Graded-index Fresnel lenses for integrated optics", Applied Optics, 21(11), pp. 1966-1971 (1982) it is known in the art that a GRIN Fresnel lens 100' can also be fabricated by a graded-index (GRIN) distribution where the refractive index n of the material of which the GRIN Fresnel lens 100' consists of is varying in dependence on the radius the Fresnel lens. This is illustrated in the lower diagram of FIG. 3, where a refractive index profile 105 describes the refractive index of the different lens segments 112, 114, 116 (cf. the upper and lower diagram in FIG. 3)

The explanation with reference to FIG. 1A for the varying height of a classical Fresnel lens 100 applies, mutatis mutandis, for the varying refractive index profile 105 of the GRIN Fresnel lens 100' as shown in FIG. 3 and is thus not repeated anymore.

It becomes however apparent from the upper diagram in FIG. 3 that in difference to the Fresnel lens 100 as shown in FIG. 1A the GRIN Fresnel lens 100' is flat and does not comprise any height difference. The optical properties of such a GRIN Fresnel lens 100' are thus only due to the varying refractive index along its radius.

Figure 4:
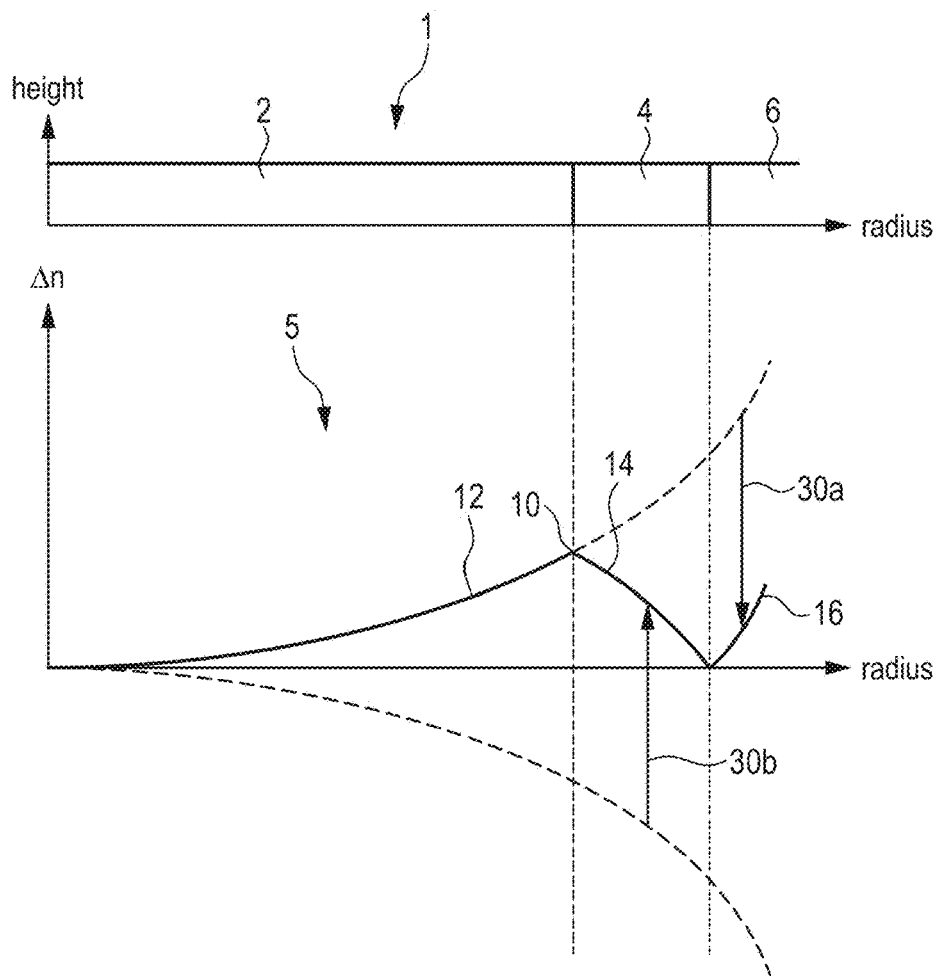
FIG. 4 shows a schematic diagram of a cross-section along a plane including the optical axis of a diffusor lens according to the present disclosure.

FIG. 4 shows a schematic diagram of a cross-section along a plane including the optical axis of a diffusor lens 1. The lower diagram in FIG. 4 shows the refractive index difference $\Delta n$ in said cross-section. The upper diagram shows the preferably constant height of the diffusor lens.

The refractive index profile 5 which describes the refractive index of the diffusor lens 1 in a cross-section along a plane including the optical axis of the diffusor lens 1 and which varies in a direction perpendicular to the optical axis (i.e., along the radius) comprises least a first sub-profile 12 and a second sub-profile 14. A third sub-profile 16 is further shown in FIG. 4. The first, second and third sub-profile 12, 14, 16 describe the refractive index profile of a first lens segment 2, a second lens segment 4 and a third lens segment 6, which are exemplarily illustrated in the upper diagram of FIG. 4 as segments or sections of the flat diffusor lens 1. The three lens segments 2, 4, 6 shown are only exemplarily and the diffusor lens 1 may comprise more lens segments.

It is further shown in the lower diagram of FIG. 4 that the first sub-profile 12 transitions to the second profile 14 at an interface 10. It is clear to the skilled person that all sub-profiles of all lens segments adjoin at respective interfaces and the transitions or crossovers between the different lens segments are continuous. Further, it is clear to the skilled person that by symmetry the rest of the diffusor lens 1 is the mirror image of what is illustrated in FIG. 4.

The sub-profiles which describe the refractive index profiles of the lens segments are all curved in this embodiment. This is essentially different to a commonly known GRIN Fresnel lens 100' as shown in FIG. 3, where the curved sub-profiles are divided by vertical steps in between (cf. lower diagram in FIG. 3). Instead of being curved, the refractive index profiles of the lens segments 12, 14, 16 of lens 1 may be not curved, but straight in cross-section along a plane including the optical axis of the lens 1. For example, the refractive index profile of the lens segments 12, 14, 16 may be conical when seen three-dimensionally, so that the refractive-index sub-profiles in cross-section along a plane including the optical axis of the lens 1 is formed by a surface line of the respective cone.

For the sake of simplicity, the following description will be pre-dominantly given for to case of lens segments with curved refractive index profiles as shown in the drawings.

The first sub-profile 12 may, e.g., be described by the function $$n_1 = n_0 + \Delta n = n_0 + n_0 \frac{\left(r\sqrt{A}\right)^2}{2},$$

where $n_1$ is the refractive index of the first sub-profile 12, $n_0$ an offset refractive index and $\Delta n$ the refractive index difference, which is illustrated in FIG. 4 for simplification and which is exemplarily proportional to the square of the radius r of the diffusor lens. $\sqrt{A}$ is a constant used for normalization.

The second sub-profile 14 may be described by the function $$n_2 = n_0 - \Delta n = n_0 - n_0 \frac{\left(r\sqrt{A}\right)^2}{2}.$$

The curvatures of the first sub-profile 12 and the second sub-profile 14 are $\pm n_0 A$ for this example (second derivative). Hence, the curvatures of the first sub-profile 12 and the second sub-profile 14 are described by the same curvature function ($n''_{1,2} \pm n_0 A$) but with opposite sign. It is shown in FIG. 4 that the second sub-profile 14 may be obtained by projecting the function $$\Delta n = -n_0 \frac{\left(r\sqrt{A}\right)^2}{2}$$

along the ordinate. This is indicated by arrow 30b.

The third sub-profile 16 may be described by the same function by which the first sub-profile 12 is described. It is shown in FIG. 4 that only a projection of the function $$\Delta n = n_0 \frac{\left(r\sqrt{A}\right)^2}{2}$$

along the ordinate is needed. This is indicated by arrow 30a.

In more generality, the function which describes the slopes of the first sub-profile 12 and the second sub-profile 14 may, e.g., be proportional to $r^n$ with r being a radius of the diffusor lens and n≥0. Hence, the slope function (first derivate function) may be proportional to a constant for n=0. This is, e.g., the case if the first sub-profile and the second sub-profile both have the shape of a linear function in cross-section along a plane including the optical axis, as it is the case, for example, for a conical refractive index profile. For n>0, the slope function may be a polynomial function.

The diffusor lens 1 as shown in FIG. 4 provides the same advantages as that of a commonly known Fresnel lenses, but additionally overcomes the problems arising from the secondary reflections at the heights steps of commonly known Fresnel lenses as shown in FIGS. 1, 2 and 3.

Additionally to varying the refractive index along the radius of the diffusor lens 1 as shown in FIG. 4, the refractive index may also be varied in azimuthal direction.

Figure 5:
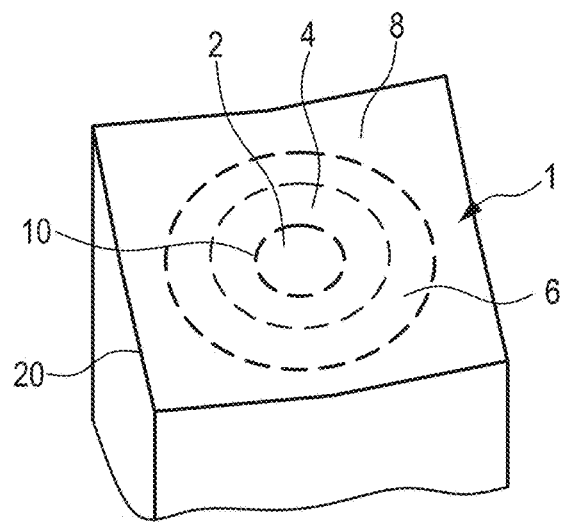
FIG. 5 shows a schematic diagram of a 3D representation of a diffusor lens according to the present disclosure with a quadratic lens aperture.

FIG. 5 shows a schematic diagram of a 3D representation of a diffusor lens 1 with a quadratic lens aperture 20. Apart from the quadratic aperture 20, the diffusor lens 1 may be the same as shown in FIG. 4. The diffusor lens 1 consists of four flat lens segments 2, 4, 6, 8 with a plane surface through which the light emerges. Each lens segment may, e.g., have a radial width of 50 µm so that the inner segment, i.e., the first lens segment 2, goes from r=0 µm to r=50 µm, the second lens segment 4 from r=50 µm to r=100 µm and so on. As the lens segments 2, 4, 6, 8 are preferably flat and not visible as they only differ in their refractive index profiles, the transitions from the different lens segments 2, 4, 6, 8 are illustrated by dashed circles in FIG. 5.

Figure 6:
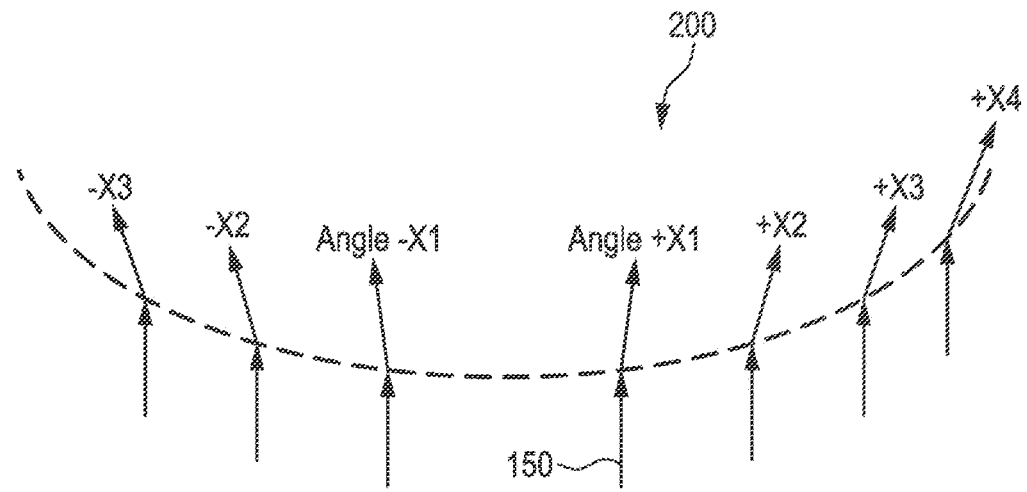
FIG. 6 shows a schematic diagram of a standard diffusor lens used in the prior art.

FIG. 6 shows a schematic diagram of a standard diffusor lens used in the prior art. The diffusor lens 200 is illuminated by parallel incoming rays 150 and each part of the diffusor lens 200 redirects the rays to a certain angle. The different angles are denoted by −X3, −X2, −X1, X1, X2 and X3. All positive angles, i.e., X1 to X3, are on the right-hand side of the lens center of the diffusor lens 200 and the same angles but with opposite sign can be found on the left-hand side of the lens center of the diffusor lens 200. For large diffusor angles, the surface slope becomes very large at the sides of the lens and the total height difference or sag of the lens is too large to be realized in a semiconductor substrate by common methods, such as grayscale lithography.

Figure 7:
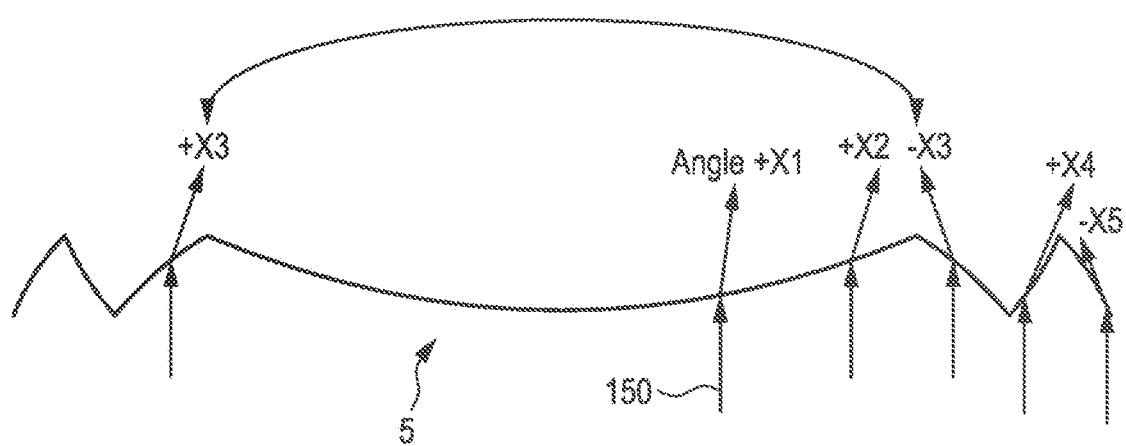
FIG. 7 shows a schematic diagram of the refractive index profile a diffusor lens according to the present disclosure.

FIG. 7 shows a schematic diagram of the refractive index profile 5 of a diffusor lens to illustrate how parallel incoming rays 150 are redirected by the diffusor lens. It becomes apparent from a comparison of FIGS. 6 and 7 that in each segment of the diffusor lens, the sign of the emission angle of the redirected rays 150 is exchanged in comparison to the prior art lens 200 as shown in FIG. 6. This means, for example, that at a position at which an angle of +X3 is generated for the prior art lens 200, an angle of −X3 is generated for the diffusor lens according to the present invention. At a position at which an angle of −X3 is generated for the prior art lens 200, an angle of +X3 is generated for the diffusor lens.

Figure 8:
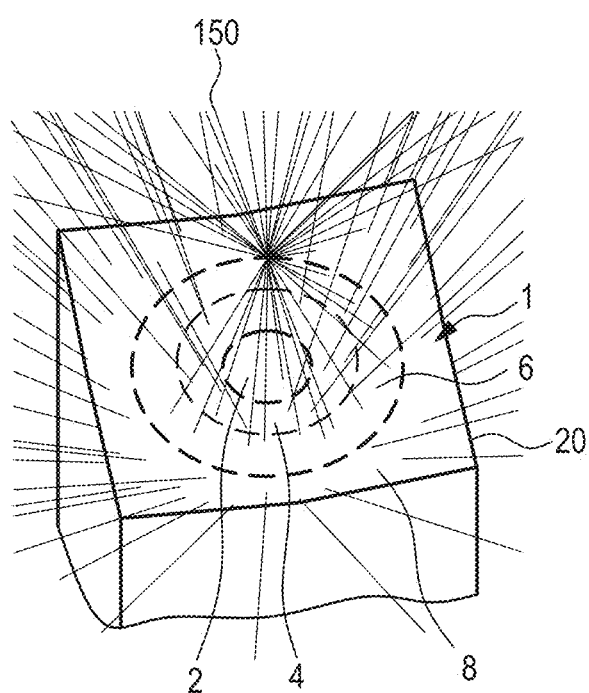
FIG. 8 shows a schematic diagram of a simulation of rays transformed by the diffusor lens according to the present disclosure.

FIG. 8 shows a schematic diagram of a simulation of rays 150 transformed by the diffusor lens 1. The diffusor lens 1 is shown again with a quadratic lens aperture 20. A multitude of rays are exemplarily simulated by ray tracing, where the path of light is simulated by taking into account their interaction with the diffusor lens 1. The simulation shows that the first lens segment 2 and the third lens segment 6 are focusing the rays 150 while the second lens segment 4 and a fourth lens segment 8 are defocusing the rays 150. In total this leads to a homogenous beam profile in the far-field by an overlapping of the rays differently transformed by the different lens segments.

In difference to the diffusor lens 1 as shown in FIGS. 4 and 7, the diffusor lens 1 as shown in FIG. 8 has a different order of lens segments with convexly and concavely-shaped sub-profiles which describe the refractive index of the lens segments. The first lens segment 2 of the diffusor lens 1 shown in FIG. 8 has a first sub-profile which has a convex shape while the second lens segment 4 has a second sub-profile which has a concave shape and so on. In difference to this, the first lens segment 2 of the diffusor lens 1 as shown in FIGS. 4 and 7 has a first sub-profile which has a concave shape while the second lens segment has a second sub-profile which has a convex shape. This difference illustrates that the diffusor lens 1 is not limited to a specific alternating order of convexly and concavely sub-profiles.

Figure 9A:
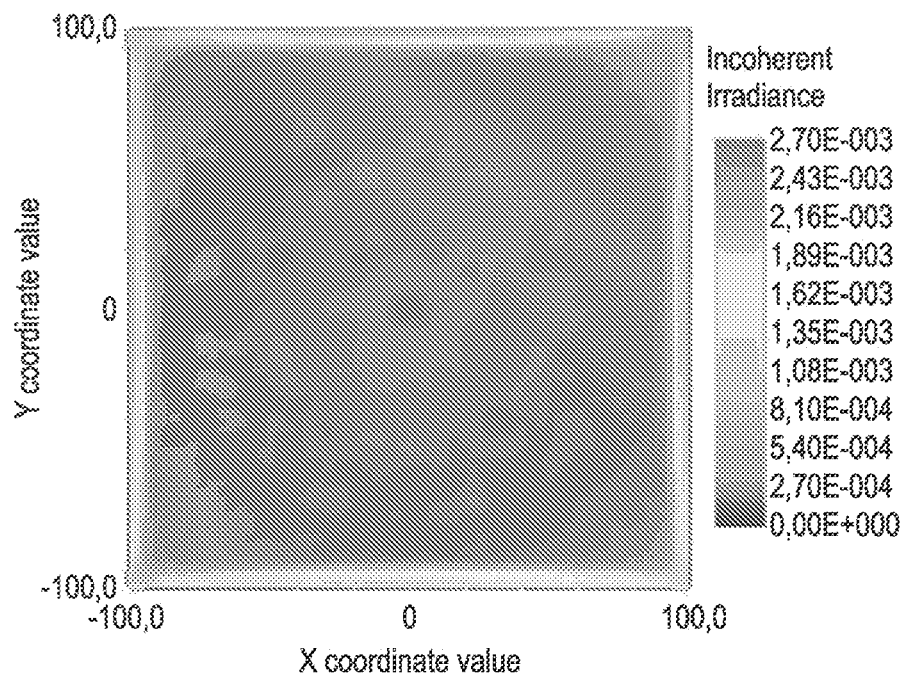
FIGS. 9A and 9B schematically show diagrams illustrating the irradiance on a flat target screen for a diffusor lens according to the present disclosure (FIG. 9A) and for a standard diffusor lens (FIG. 9B)
Figure 9B:
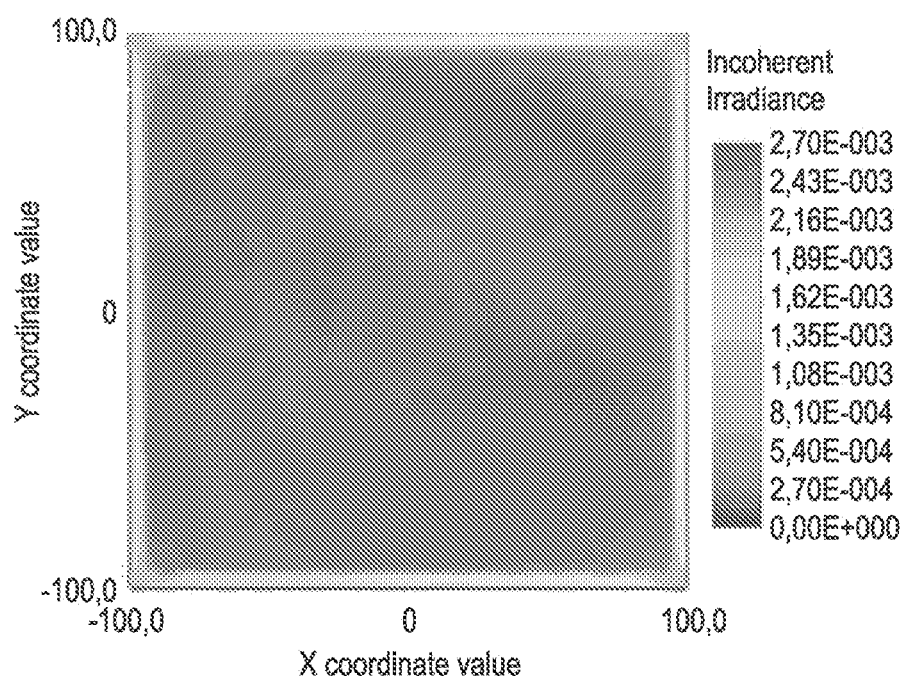

FIGS. 9A and 9B schematically show diagrams illustrating the irradiance on a flat target screen for a diffusor lens 1 according to the present disclosure (FIG. 9A) and for a standard diffusor lens (FIG. 9B), such as the diffusor lens 200 as shown in FIG. 6. Both profiles of the irradiance provide the same functionality and homogeneity, but the diffusor lens according to the present disclosure has a much smaller height. In case, the diffusor lens is a meta-lens, the height can be on the nanometer scale. Hence, the same functionality and homogeneity is achieved with a much thinner diffusor lens.

Figure 10:
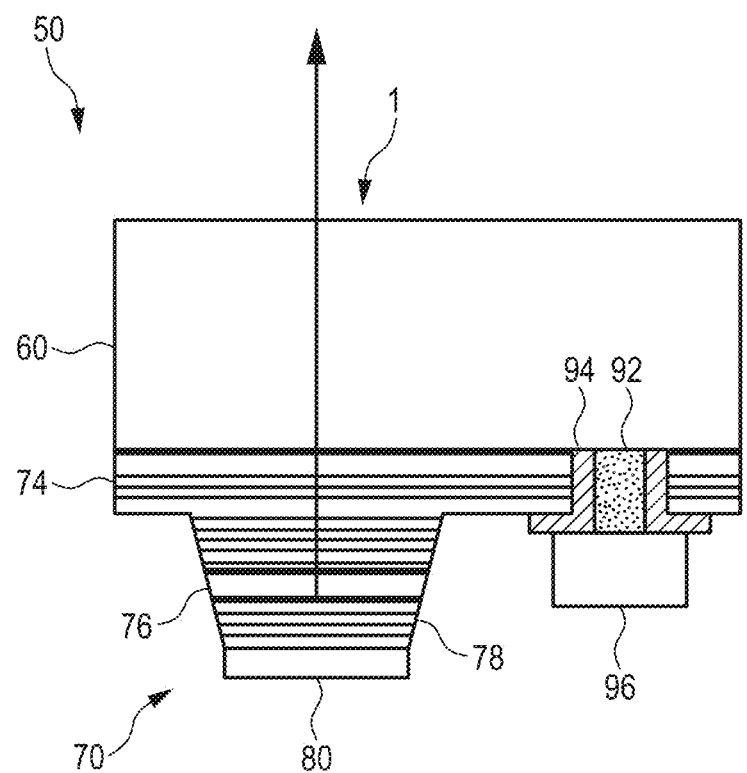
FIG. 10 shows a schematic diagram of a light source according to the present disclosure.

FIG. 10 shows a schematic diagram of a light source 50. The substrate 60 may comprise a semiconductor material, in particular a III-V compound semiconductor, in particular gallium arsenide (GaAs). On one side of the substrate 60, a VCSEL 70 is arranged which may comprise an optical resonator comprising a first mirror such as a distributed Bragg reflector (DBR) 74, an active layer 76 and a second mirror such as a DBR 78. The first DBR 74, the active layer 76 and the second DBR 78 may comprise several layers forming the layer structure of the VCSEL 70. The first DBR 74 is arranged on the substrate 60, and the active layer 76 is sandwiched between the first DBR 74 and the second DBR 78. The first DBR 74 and the second DBR 78 may comprise a multitude of pair of layers with different refractive indices to provide reflectivity. The active layer 76 may comprise one or more quantum well layers. The optical resonator formed by the DBRs 74 and 78 and the active layer 76 is characterized by a mesa structure which is etched down to an intermediate layer of the first DBR 74. The second DBR 78 is covered by an electrical contact 80 to contact the VCSEL 70. Another contact 92 provides an electrical contact to the substrate 60. The electrical contact 92 is separated from the first DBR 74 by an electrical isolator 94. An electrical bond 96 is conductively connected to the electrical contact 92.

The diffusor lens 1 may be, as shown in FIG. 10, integrated in the substrate 60. In other words, the diffusor lens 1 is "buried" in the substrate 60 by varying the refractive index of the substrate material 60 as shown, e.g., in FIG. 4.

The VCSEL 70 as shown in FIG. 10 is a so-called bottom emitter, i.e. laser light emission generated in the optical resonator 74, 76, 78 is transmitted through the substrate 60 and through the diffusor lens 1 integrated in the substrate 60.

It shall be understood that this is only exemplarily. The VCSEL may, e.g., also be a top emitter and the diffusor lens may be provided on top of the semiconductor layer structure of the VCSEL 70, such as on top of the second DBR 78.

Further, it shall be understood that the present disclosure is not limited to a light source 50 with one VCSEL 70 and one diffusor lens 1. The present disclosure also relates to an array of VCSELs 70 arranged on a common semiconductor substrate 60, each of which VCSELs 70 configured to emit laser light, and at least one diffusor lens 1 associated with the VCSELs 70 of the array of VCSELs and configured to diffuse the laser light emitted by the VCSELs 70 (not shown).

Figure 11:
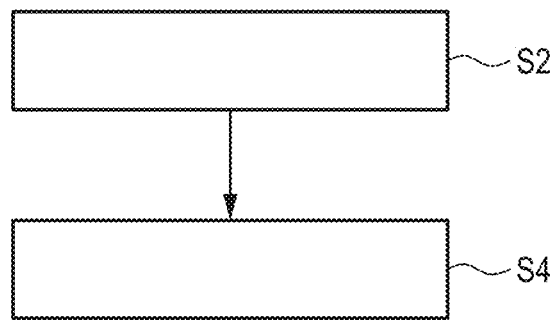
FIG. 11 shows a principle flow diagram of a method of fabricating a light source according to the present disclosure.

FIG. 11 shows a principle flow diagram of a method of fabricating a light source.

At S2, a VCSEL 70 arranged on a semiconductor substrate 60 is provided. The semiconductor substrate 60 has an initial surface which preferably is planar. The semiconductor substrate 60 may comprise GaAs.

At S4, a diffusor lens 1 is provided which is integrated with the VCSEL 70. The diffusor lens 1 is arranged to transform the laser light emitted by the VCSEL 70 such that a homogenous beam profile in a target area is achieved. As shown in FIG. 10, the diffusor lens 1 may be integrated within the material of the substrate 60.

Figure 12:
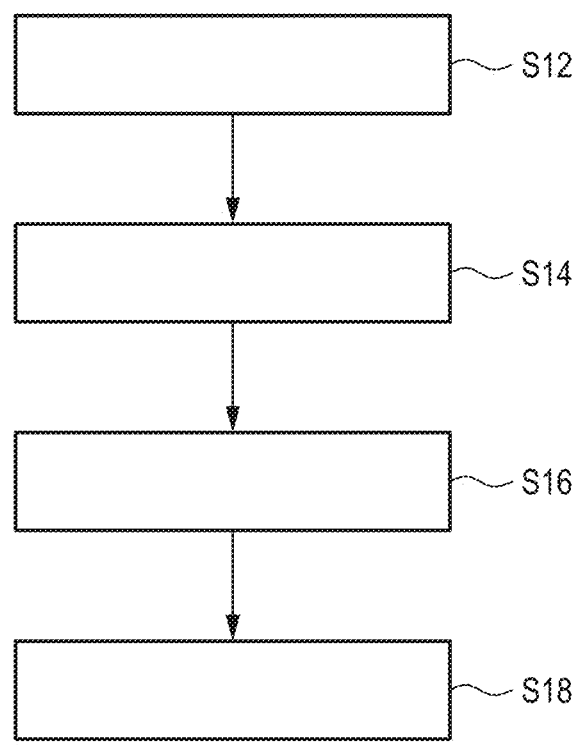
FIG. 12 shows a principle flow diagram of a method of illuminating a scene according to the present disclosure.

FIG. 12 shows a principle flow diagram of a method of illuminating a scene.

At S12, a VCSEL 70 is provided. At S14, a diffusor lens 1 according to the present invention is provided. At S16, the VCSEL 70 is caused to emit laser light and at S18, the laser light emitted by the VCSEL 70 is diffused, by the diffusor lens 1, into a target area.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A diffusor lens, comprising:
    a first annular lens segment and a second annular lens segment, the first and the second lens segments being concentric,
    wherein a refractive index of the first and second lens segments in a cross-section along a plane including an optical axis of the diffusor lens is described by a refractive index profile which varies in a direction perpendicular to the optical axis and which comprises:
    a first sub-profile, which describes the refractive index profile of the first lens segment, and a second sub-profile, which describes the refractive index profile of the second lens segment,
    wherein the first sub-profile transitions to the second sub-profile at an interface,
    wherein the first and second sub-profiles have slopes with opposite signs, and
    wherein one of the first and second sub-profiles is convexly curved, and another one of the first and second sub-profiles is concavely curved.

2. The diffusor lens according to claim 1, wherein the slopes of the first sub-profile and the second sub-profile are described by a same slope function but with opposite signs.

3. The diffusor lens according to claim 2, wherein the slope function which describes the slopes of the first sub-profile and the second sub-profile is proportional to $r^n$ with r being a radius of the diffusor lens and $n \geq 0$.

4. The diffusor lens according to claim 1, wherein the diffusor lens is a gradient index (GRIN) lens or a meta-lens.

5. The diffusor lens according to claim 1, wherein the transition from the first sub-profile to the second sub-profile at the interface is continuous and not continuously differentiable.

6. The diffusor lens according to claim 1, further comprising at least one additional lens segment, wherein the at least one additional lens segment is circular concentric.

7. The diffusor lens according to claim 1, wherein a geometrical aperture of the diffusor lens is rectangular.

8. A light source, comprising:
    a Vertical Cavity Surface Emitting Laser (VCSEL), arranged on a semiconductor substrate and configured to emit laser light; and
    a diffusor lens according to claim 1,
    wherein the diffusor lens is configured to diffuse the laser light emitted by the VCSEL.

9. The light source of claim 8, wherein the diffusor lens is integrally formed with the VCSEL.

10. The light source according to claim 8, wherein the diffusor lens is integrated in a semiconductor substrate on which the VCSEL is arranged.

11. The light source according to claim 10, wherein the VCSEL is a bottom emitter which is arranged to emit the laser light through the semiconductor substrate, wherein the diffusor lens is arranged on a surface of the semiconductor substrate or integrated into the semiconductor substrate which is arranged opposite with respect to the VCSEL.

12. The light source according to claim 8, wherein the VCSEL is a top emitter which is arranged to emit the laser light in a direction away from the semiconductor substrate, wherein the diffusor lens is arranged on top of the semiconductor layer structure of the VCSEL.

13. The light source according to claim 8, comprising an array of VCSELs arranged on a common semiconductor substrate, each VCSEL of the array of VCSELs configured to emit laser light, and one or more diffusor lenses associated with the VCSELs of the array of VCSELs and configured to diffuse the laser light emitted by the associated VCSELs.

14. A method of fabricating a light source, the method comprising:
    providing a Vertical Cavity Surface Emitting Laser (VCSEL) arranged on a semiconductor substrate; and integrating a diffusor lens with the VCSEL, the diffusor lens comprising a first annular lens segment and a second annular lens segment, the first and the second lens segments being concentric, wherein a refractive index of the first and second lens segments in a cross-section along a plane including an optical axis of the diffusor lens is described by a refractive index profile which varies in a direction perpendicular to the optical axis and which comprises: a first sub-profile, which describes the refractive index profile of the first lens segment, and a second sub-profile, which describes the refractive index profile of the second lens segment, wherein the first sub-profile transitions to the second sub-profile at an interface, wherein the first and second sub-profile have slopes with opposite signs, and wherein one of the first and second sub-profiles is convexly curved, and another one of the first and second sub-profiles is concavely curved.

15. A method of illuminating a scene, the method comprising:

providing a Vertical Cavity Surface Emitting Laser (VCSEL);

providing a diffusor lens, the diffusor lens comprising a first annular lens segment and a second annular lens segment, the first and the second lens segments being concentric;

causing the VCSEL to emit laser light; and diffusing, by the diffusor lens, the laser light emitted by the VCSEL into a target area, wherein a refractive index of the first and second lens segments in a cross-section along a plane including an optical axis of the diffusor lens is described by a refractive index profile which varies in a direction perpendicular to the optical axis and which comprises: a first sub-profile, which describes the refractive index profile of the first lens segment, and a second sub-profile, which describes the refractive index profile of the second lens segment, wherein the first sub-profile transitions to the second sub-profile at an interface, wherein the first and second sub-profiles have slopes with opposite signs, and wherein one of the first and second sub-profiles is convexly curved, and another one of the first and second sub-profiles is concavely curved.

* * * * *